United States Patent [19]
Meinel et al.

[11] Patent Number: 4,795,518
[45] Date of Patent: Jan. 3, 1989

[54] METHOD USING A MULTIPLE DEVICE VACUUM CHUCK FOR AN AUTOMATIC MICROELECTRONIC BONDING APPARATUS

[75] Inventors: Walter B. Meinel; Hubert J. Biagi, both of Tucson, Ariz.

[73] Assignee: Burr-Brown Corporation, Tucson, Ariz.

[21] Appl. No.: 868,875

[22] Filed: May 23, 1986

Related U.S. Application Data

[63] Continuation of Ser. No. 581,280, Feb. 17, 1984, abandoned.

[51] Int. Cl.$^4$ ............................................. B25D 11/00
[52] U.S. Cl. ..................... 156/285; 228/4.5; 269/21; 279/3
[58] Field of Search .............. 156/285; 279/3; 269/21, 269/73, 303; 228/4.5, 7, 904, 179

[56] References Cited

U.S. PATENT DOCUMENTS

| | | | |
|---|---|---|---|
| 2,443,987 | 6/1948 | Morrison et al. | 269/21 |
| 3,389,682 | 6/1968 | Gardner | 279/3 |
| 3,484,093 | 12/1969 | Mermelstein | 269/21 |
| 3,617,045 | 11/1971 | DaCosta et al. | 279/3 X |
| 3,872,566 | 3/1975 | Pedrotti | 228/4.5 |
| 4,039,114 | 8/1977 | Yoshida et al. | 228/4.5 X |
| 4,357,006 | 11/1982 | Hayes | 279/3 X |
| 4,603,867 | 8/1986 | Babb et al. | 279/3 |

FOREIGN PATENT DOCUMENTS

| | | | |
|---|---|---|---|
| 5318967 | 2/1978 | Japan | 269/21 |
| 0608407 | 1/1979 | Switzerland | 269/21 |
| 0646862 | 11/1950 | United Kingdom | 269/21 |

OTHER PUBLICATIONS

Von Kaenel, W., IBM Tech. Discl. Bulletin, "Vacuum Chuck", vol. 6, No. 7, Dec. 1963, p. 61.

Primary Examiner—Michael W. Ball
Assistant Examiner—Ramon R. Hoch
Attorney, Agent, or Firm—Cahill, Sutton & Thomas

[57] ABSTRACT

A vacuum chuck for securely holding integrated circuit hybrid package substrates in fixed relationship to an X/Y table that is subjected to severe repeated lateral acceleration and decceleration forces to prevent appreciable lateral displacement of the package substrate relative to the X/Y table. A plurality of shallow, closed loop grooves are disposed in the chuck. A resilient O ring is disposed in each groove and normally extends a small but precise amount above the surface of the base. A vacuum path opens into each region circumscribed by an O ring. When a package substrate is positioned on an O ring and the vacuum then is applied, the O ring is compressed, causing the sides of the O ring to tightly engage the walls of the groove, preventing the O ring from "rolling" in the groove as a result of lateral acceleration and decceleration forces on the package. The compression increases the contact area between the O ring and the package substrate to produce sufficient friction to prevent lateral movement of the package substrate relative to the O ring. The vacuum chuck, used in conjunction with an automated wire bonding machine and an automated die bonding machine, allows rapid loading of multiple hybrid integrated circuit package substrates on the vacuum chuck.

7 Claims, 2 Drawing Sheets

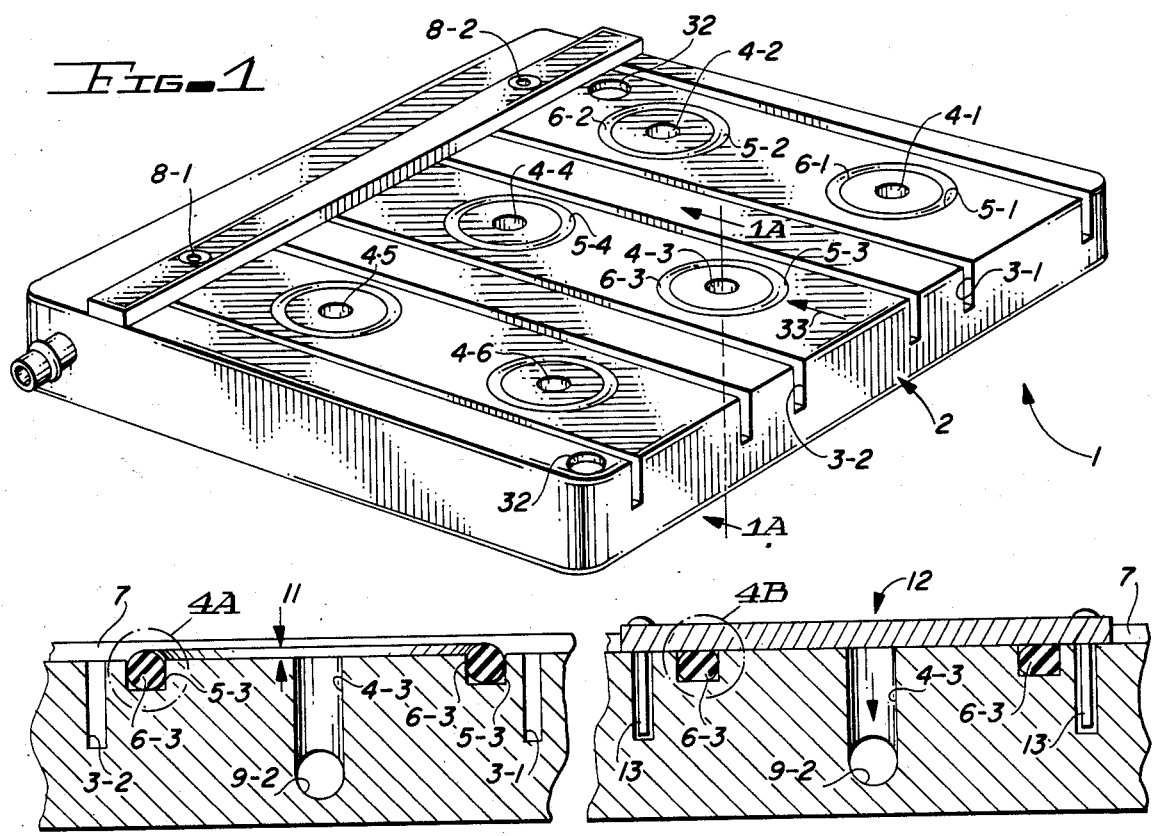
FIG-1
FIG-1A
FIG-1B
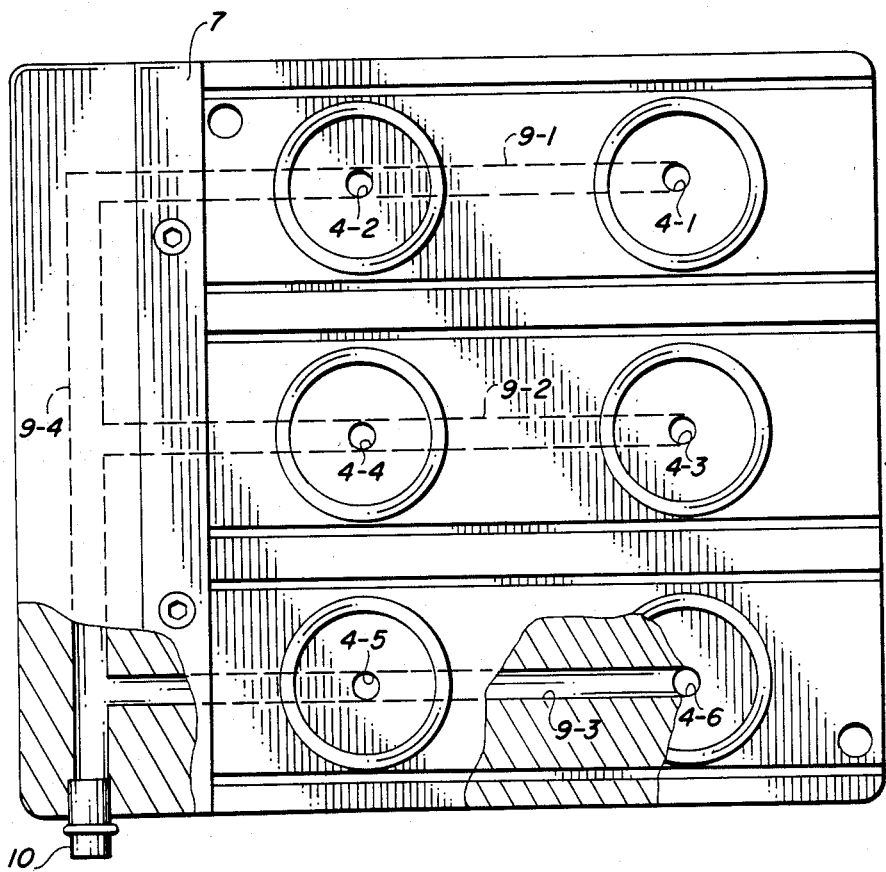
FIG-1C

METHOD USING A MULTIPLE DEVICE VACUUM CHUCK FOR AN AUTOMATIC MICROELECTRONIC BONDING APPARATUS

This is a continuation of application Ser. No. 581,280, filed Feb. 17, 1984, now abandoned.

BACKGROUND OF THE INVENTION

The invention relates to vacuum chucks for holding workpieces, and more particularly to vacuum chucks capable of holding multiple workpieces, especially microelectronic circuit package substrates, precisely in position despite repeated application of severe lateral forces to the workpieces.

Previously, die bonding or wire bonding of hybrid integrated circuits has usually involved performing all required die bonding or wire bonding operations on one single hybrid package substrate at a time. In some instances, wherein mechanical clamps have been utilized to attach the hybrid substrate to an X/Y table or chuck, for example, in an automated wire bonding or die bonding machine, excessive amounts of time have been required for loading and unloading the hybrid package substrates. For example, when vacuum chucks have been used to hold the hybrid package substrate against the surface of the vacuum chuck, there has been a problem in preventing minute amounts of cummulative lateral displacement of the hybrid package substrate as the X/Y chuck automatically moves the package substrate from one bonding location to another to successively align different bonding pads on the package substrate or an integrated circuit chip thereon with a wire bonding head of a wire bonding machine. The X/Y chucks are controlled by servomechanisms which rapidly move the X/Y chuck from one bonding location to another, and thereby subject the hybrid substrate to severe repetitive lateral forces, each time causing a small amount of lateral displacement of the package substrate relative to the chuck. For example, Hughes Aircraft Company, Industrial Products Division of Carlsbad, Calif., has recently manufactured very sophisticated wire bonding machines and die bonding machines. These machines include an X/Y table or base to which a package holding fixture or chuck can be attached, a die bonding head or wire bonding head, a TV camera, a TV monitor, a microscrope lens through which the TV camera can monitor the hybrid package substrate or integrated circuit die presently being bonded, and a computer which stores an operating program and data that determines the precise location of the X/Y table for each bonding operation on each hybrid package substrate. These automatic bonding machines would be ideally suited to automatic die bonding and automatic wire bonding of many hybrid integrated circuits on a single vacuum chuck if such a chuck were available. It would be highly desirable if the chuck could be very rapidly loaded and unloaded. It is imperative that every hybrid package be held very securely in fixed relationship to the chuck and avoid even minute amount of lateral displacement due to forces produced on the hybrid substrate or any integrated circuit die thereon by bonding and/or acceleration and decceleration forces as the X/Y table rapidly and abruptly moves from one bonding location to another.

Although various vacuum chucks have been used in the integrated circuit industry for years, such as the one shown in U.S. Pat. No. 3,617,045 by Da Costa et al., none of the prior vacuum chucks devices have overcome the above described problems. Although various vacuum sealing techniques have been used in conjunction with holding workpieces in place, to our knowledge no vacuum chuck has been provided, either in conjunction with integrated circuit bonding equipment or other applications, which overcomes the above-mentioned problems and permits low cost, rapid loading of multiple hybrid integrated circuit package substrates on a bonding machine and allows automatic, very rapid alignment of hundreds of locations on each package substrate with a bonding head and avoids essentially all lateral displacement of the package substrate due to the repetitive acceleration and decceleration forces. The above U.S. Pat. Nos. 3,617,045 and 3,580,460, 4,039,114, 3,409,977, and 3,973,713 are generally indicative of the state of the art.

Therefore, there is a need for a technique and apparatus for holding a workpiece securely and very precisely in a vacuum chuck despite numerous repetitive procedures which subject the workpiece to lateral acceleration and decceleration forces.

SUMMARY OF THE INVENTION

Accordingly, it is an object of the invention to provide an economical apparatus and technique for directly holding a workpiece such as an integrated circuit hybrid package substrate in extremely precise fixed relationship to a supporting base by means of a vacuum, despite repeated forces applied to the workpiece.

It is another object of the invention to provide an economical apparatus and method for holding a workpiece very securely in an extremely precise, fixed relationship to a movable support that is subjected to numerous severe repetitive acceleration and decceleration forces.

It is another object of the invention to provide an economical apparatus and method for precisely holding a plurality of workpieces in extremely precise fixed relationship to a movable base which repetitively subjects all of the workpieces to substantial lateral forces.

It is another object of the invention to provide a highly automated die bonding device and a highly automated wire bonding device for manufacture of microelectronic hybrid integrated circuits to achieve very rapid loading and unloading of hybrid package substrates onto or from a single vacuum chuck and precisely maintain the positions of multiple loaded package substrates during numerous successive bonding on each hybrid package substrate.

Briefly described, and in accordance with one embodiment thereof, the invention provides an apparatus and method for causing a hold vacuum to a workpiece in very precise fixed relationship to a support despite application of repeated severe forces which would otherwise tend to cause lateral displacement of the workpiece relative to the support by causing the vacuum to draw the workpiece against a resilient O ring disposed in a close-fitting groove to provide a vacuum-proof seal between the workpiece and the support, creating a high degree of friction between the workpiece and the O ring. In the described embodiment of the invention, the support includes a vacuum chuck attached to a computer controlled X/Y table of an automatic wire bonding machine or an automatic die bonding machine that is capable of very rapidly moving the X/Y table to successively align numerous bonding sites on an integrated circuit hybrid package substrate or on integrated circuit chips thereon with a suitable bonding head. The computer controlled X/Y table is reptitively moved by means of very high speed servomechanisms that subject the X/Y table and a plurality of integrated circuit hybrid package substrates being held on the vacuum chuck to very high lateral acceleration and decceleration forces. The O rings are each disposed in corresponding close fitting circular or oval grooves that have been machined into the flat upper surface of the vacuum chuck. Each O ring extends a precise amount above the flat upper surface of the vacuum chuck so that when the vacuum is applied, each hybrid substrate is drawn against a corresponding O ring, compressing it enough to cause its sides to tightly contact the groove walls and enlarge and flatten the contact area between that O ring and the surface of the hybrid substrate. The increased surface area increases frictional resistance between the O ring and the hybrid substrate, effectively resisting any lateral movement of the hybrid substrate relative to the O ring. The tight frictional engagement of each O ring with the walls of its corresponding groove prevents "rolling" or lateral displacement of the O ring in its groove during the repetitive application of the above-mentioned lateral acceleration and decceleration forces. This prevents any slippage of the O rings relative to the grooves. The precise distance by which of each of the O rings extends above the surface of the plate is also selected such that the bottom surface of each hybrid substrate is drawn tightly against the upper surface of the plate in order to achieve intimate thermal contact therewith, so that heat from the plate is transferred to each hybrid substrate to raise its temperature to a level needed for effective thermosonic bonding. A plurality of pairs of relatively deep parallel grooves are provided in the upper surface of the vacuum chuck, one such groove on either side of each row of O rings and O ring grooves, for receiving leads extending from the bottom of each hybrid substrate. This allows the hybrid substrates to be laterally slid along the surface of the chuck with their leads in the corresponding grooves to effectuate efficient loading and unloading of hybrid substrates onto or from the vacuum chuck.

BRIEF DESCRIPTION OF THE DRAWINGS

FIG. 1 is a perspective view of the multiple site vacuum chuck of the present invention, showing several integrated circuit hybrid substrate positions thereon.

FIG. 1A is a section view taken along section line 1A–1A of FIG. 1.

FIG. 1B is a section view useful in explaining the invention.

FIG. 1C is a top view diagram of the vacuum chuck shown in FIG. 1.

DESCRIPTION OF THE INVENTION

Figure 2:
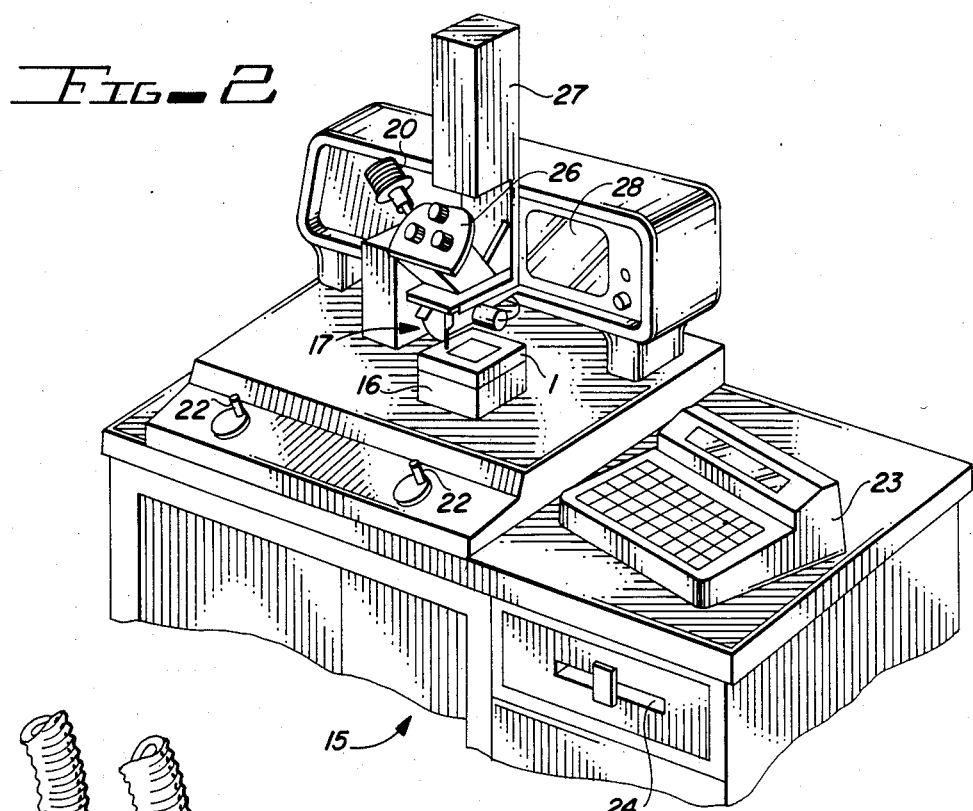
FIG. 2 is a perspective view of an automatic bonding machine in conjunction to which the vacuum chuck of FIG. 1 is attached for use.

Referring first to FIG. 1, reference numeral 1 designates the multiple-workpiece vacuum chuck of the present invention. Its purpose is to securely, precisely hold, by means of a vacuum, six integrated circuit hybrid package substrates 12 (hereinafter referred to simply as hybrid substrates) of the type shown in FIG. 3 in fixed precise relationship to vacuum chuck 1 during automatic die bonding operations, or automatic wire bonding operations performed by the automatic wire bonding machine 15 shown in FIG. 2. Before describing in detail all of the features of vacuum chuck 1, it first will be helpful to understand in more detail the structure of the conventional hybrid substrates 12 which are to be held in place by the vacuum chuck 1 of FIG. 1.

Figure 3:
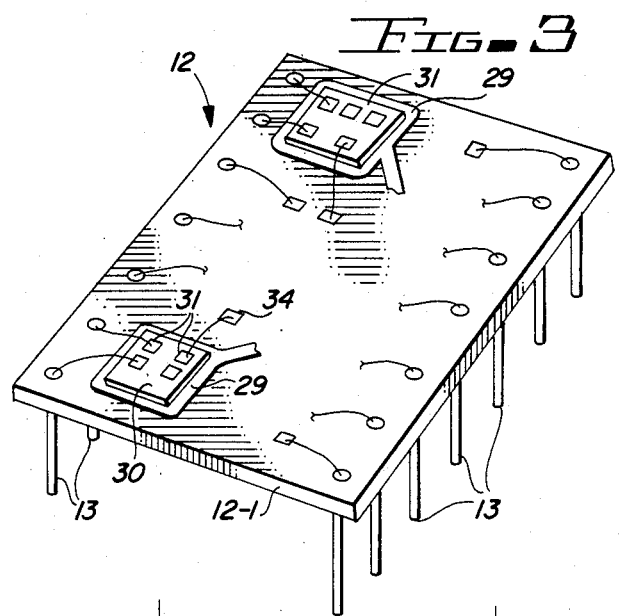
FIG. 3 is a perspective view of a typical integrated circuit hybrid substrate on which bonding operations are performed in accordance with the present invention.

Referring now to FIG. 3, hybrid substrate 12 includes a flat, rectangular, ceramic plate 12-1. The lower surface of ceramic plate 12-1 is quite flat, having a maximum deviation from flatness of approximately 3 mils. It would be possible to obtain a more truly flat lower surface by performing a lapping operation on it, but that would be unduly expensive. It is one purpose of the present invention to avoid the need to lap the bottom surfaces of such ceramic layers of hybrid substrates before using a vacuum chuck to hold them in place.

A plurality of gold plated metal leads 13 arranged in two rows are attached to and extend from the bottom surface of ceramic plate 12-1. These leads 3 extend through and are soldered to various metal connectors that are patterned on the top surface of ceramic layer 12-1. There are a plurality of gold plated die bonding pad locations, such as 29 on the top surface of ceramic plate 12-1, on which semiconductor die need to be die bonded, as is well understood by those skilled in the art. One end of a length of gold bonding wire is wire bonded, respectively, to each bonding pad 31 of any integrated circuit die such as 30, to which wire bonds must be made. The other end of each length of gold were is connected to another bonding pad, which can be a bonding pad or another die or a bonding pad such as 34 that is patterned directly on ceramic plate 12-1.

Referring now to FIG. 2, an automatic computer controlled wire bonding machine 15 is shown, on which the vacuum chuck 1 of FIG. 1 can be attached. This machine can be a Model 2460 manufactured by Hughes Aircraft Company, Industrial Products Division of Carlsbad, Calif. In order to fully appreciate the invention, it is helpful to understand the capabilities of the automatic die bonding machine 15. Reference numeral 16 designates a computer controlled X/Y table or pedestal. Vacuum chuck 1 of FIG. 1 is bolted by means of screws extending through holes 32 (FIG. 1) to X/Y table 16. Positioned over vacuum chuck 1 is a laterally stationary assembly including a microscope 26, a gold wire spool 20, a wire bonding head assembly 17, and a television camera 27 which can view the magnified image of a particular integrated circuit bonding pad or die bonding pad which is precisely positioned beneath the lens of microscope 26. Positioning of X/Y table 16 can be controlled automatically by computer 23 or manually by an operator by means of X and Y controls 22. A television monitor 28 continuously displays the magnified image being produced through a built in lens of microscope 26. A floppy disc drive unit 24 allows the computer 23 to quickly load a program and data corresponding to the precise locations of all the bonding pads that are to be bonded. The six hybrid substrates that can be loaded onto vacuum chuck 1 each may require a hundred or more individual wire bonds in order to wire bond all of the various integrated circuit bonding pads to the various bonding pads patterned on the surface of the respective hybrid substrates 12. Between each bonding operation, a powerful servomechanism receives information from computer 23 determining where the X/Y table 16 is to move next.

Figure 2A:
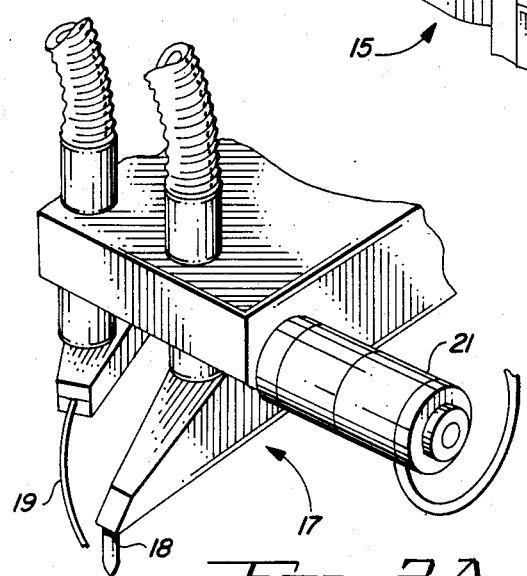
FIG. 2A is a perspective view diagram of the wire bonding head portion of the machine of FIG. 2.

Each change in position of X/Y table 16 is effectuated with a very large amount of acceleration and decleration in order to cause the wire bonding operation (or die bonding operation) to proceed as rapidly as possible. It therefore is essential that there be no permanent displacement of any of the hybrid substrates 12 as a result of any of this abrupt starting and stopping of X/Y table 16, since the cummulative result of any such displacement, after hundreds of successive abrupt movements of X/Y table 16, would cause successively larger misalignments of the small (typically four mils square) bonding pads with the wire bonding head 18 shown in FIG. 2A. Those skilled in the art know that each wire bond must be generally centered within each such bonding pad if the resulting wire bond is to be reliable. Obviously, therefore, the amount of cumulative lateral displacement of the hybrid substrates 12 after being subjected to hundreds of high magnitude lateral accelerations and decelerations produced by a high speed computer-controlled wire bonding machine such as the above-mentioned Hughes Aircraft Company Model 2460, must be so little that the final wire bond is still centered within the four mil bonding pad before the vacuum is released. In FIG. 2A, reference numeral 19 represents the feed of the gold wire held on spool 20 of automatic wire bonding machine 15 in FIG. 2. Reference numeral 21 in FIG. 2A designates a wire clamp solenoid in the bonding head assembly 17, as one well skilled in the art will understand.

Now that the "environment" in which the vacuum chuck 1 of the present invention is used is understood, vacuum chuck 1 will be described in detail. Returning now to FIGS. 1, 1A, 1B and 1C, vacuum chuck 1 includes a flat plate 2, which in one present embodiment of the invention is 0.5 inches thick, 4.75 inches long, and 4 inches wide. It is composed of hard anodized aluminum.

Six vacuum holes 4-1, 4-2, 4-3, 4-4, 4-5 and 4-6 are all connected to a common vacuum source (not shown) by vacuum passages within plate 2. These vacuum passages are best shown in FIG. 1C, wherein it can be seen that vacuum holes 4-1 and 4-2 are in open communication with internal air passage 9-1. Similarly, vacuum holes 4-3 and 4-4 that extend to the top surface of plate 2 communicate with internal vacuum passage 9-2, and vacuum holes 4-5 and 4-6 communicate with vacuum passages 9-2 and 9-3, respectively. Internal passages 9-1, 9-2 and 9-3 all open into internal passage 9-4, which is connected to an external vacuum connector element 10, onto which a standard vacuum source can be connected. Typically, a manufacturing plant vacuum system that draws roughly 10 pounds per square inch of vacuum will be connected to external vacuum connector element 10.

Referring particularly to FIG. 1, surrounding and concentric with each of the vacuum holes 4-1, 4-2, etc. is a concentric groove such as groove 5-1, 5-2, 5-3, 5-4 etc. These grooves are hereinafter referred to as O ring grooves. Each of the O ring grooves has a substantially square cross section, as can be seen in FIG. 1A (which is a sectional view along section lines 1A—1A of FIG. 1).

Disposed in each O ring groove is a resilient O ring such as 6-1, 6-2, 6-3, etc. As can be seen best in FIG. 1A, when no hybrid package substrates are positioned on vacuum chuck 1, each of the O rings extends above the upper flat surface of plate 2 by a small tolerance indicated by reference numeral 11 in FIG. 1A.

Each pair or row of the above described hybrid substrate locations of vacuum chuck 1 including a vacuum hole such as 4-3, an O ring groove such as 5-3, and an O ring such as 6-3 is positioned between a pair of deep, longitudinal parallel grooves such as 3-1 and 3-2. The purpose of the grooves 3-1, 3-2 is to receive the two rows of leads 13 of hybrid substrate 12 (FIG. 3). Thus, it can be seen that the hybrid substrate 12 can be easily "loaded" with vacuum chuck 1 by simply sliding each hybrid substrates in the direction indicated by arrow 33 in FIG. 1 with its two rows of leads 13 in the grooves 3-1 and 3-2. The package substrates typically would slide from a portable carrier having similar lead-receiving grooves. The package substrates would be slid to the left in the direction of arrow 33 until the first hybrid substrate abuts rigid alignment plate 7. The center-to-center spacing in the direction of the lead receiving grooves 3-1, 3-2 between the vacuum holes such as 4-3 and 4-4 is precisely equal to the length of each of the hybrid substrates, so that each is geometrically centered over one of the vacuum holes 4-1, 4-2 and the corresponding O rings 6-1, 6-2, etc. after all of the hybrid substrates have been loaded onto vacuum chuck 1. Then, the vacuum is applied.

At this point, it should be noted that there is no reason that the O ring grooves and O rings need to be perfectly circular, as shown in FIG. 1. For hybrid sbstrates that are rectangular, rather than square, it is preferable to make the O ring grooves more oval, or perhaps even nearly rectangular in shape. It should also be appreciated that it is not essential to that the O rings be removably positioned in the O ring grooves and, in fact, the O rings could be bonded to the inner surface of the O ring grooves. Typically, however, inexpensive O rings composed of suitable polymer or rubber materials can be used, depending on the temperature to which vacuum chuck 1 must be raised. (In a typical wire bonding operation, the plate 6.3 is heated to a pretermined temperature, typically 150° C., to achieve thermosonic bonding.) However, it is essential that cross sectional diameters of the O rings be such that each extends above the surface of plate 2 by the proper tolerance 11 previously referred to, and it is highly desirable that the sides of the O rings tightly contact opposed walls of the O ring grooves in order to prevent "rolling" or lateral displacement of the O rings when the X/Y table is subjected to sharp acceleration or decelleration as it is being started or stopped during a lateral transition to align a bonding location on the hybrid substrate with the bonding head 18 (FIG. 2A).

Typically, we have found that the distance 11 should be five mils plus or minus two mils for the situation in which the deviation from perfect flatness of the bottom surface of the hybrid substrates 12 is approximately three mils. This value of distance 11 ensures a good vacuum seal and adequate comprression of the O ring to prevent rolling of the O ring in its groove and ensures adequate flattening of the O ring surface against the hybrid substrate on the flatted O ring surface.

Figure 4A:
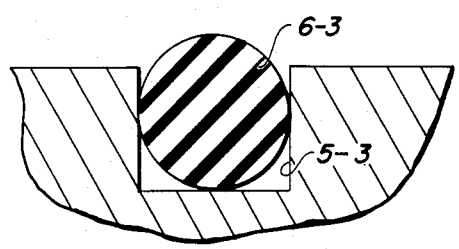
FIGS. 4A and 4B are enlarged views of details 4A and 4B in FIGS. 1A and 1B, respectively.
Figure 4B:
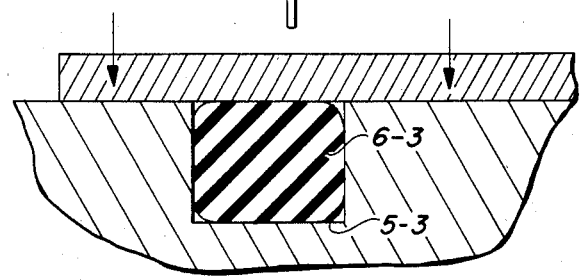

More specifically, the value of distance 11 ensures that when the hybrid substrate 12 is drawn downward in the direction of arrow 14 in FIG. 1B by a vacuum being produced in the above-mentioned vacuum passages inside vacuum chuck 1, the O rings have their upper surface substantially flattened as shown in FIG. 1B and FIG. 4B. Although it is not essential that all of the interior surface of each of the O ring groove be in contact with O ring material when the hybrid substrate 12 has been pulled tightly against the upper surface of plate 2, it is essential that at least one of, and preferably both of the side surfaces of the O ring material be tightly pressed against the opposite walls of that particular O ring groove to avoid the above-mentioned rolling or lateral displacement of the O ring. Another constraint on the dimension 11 indicated in FIG. 1A is that the durometer reading of the O rings be such that the vacuum pulls hybrid substrate 12 tightly against and in good thermal contact with the upper surface of plate 2 so that the hybrid substrate 12 and the integrated circuit dice attached thereto are rapidly heated to approximately 150° C., so that proper thermosonic bonding can take place. We have found a durometer rating of 40 to 70 to be satisfactory.

In operation, once vacuum chuck 1 is loaded with six hybrid substrates and the vacuum has been applied to produce the configuration shown in FIG. 1B at each of the six substrate holding locations, the operator initially manually aligns one of the hybrid substrates so that the bonding pads of one of the integrated chips appear on the screen of monitor 28. This manipulation is done manually by means of X and Y control levers 22. Then a command is given to computer 23 to cause it to begin automatic bonding operation. The computer's stored program has a pattern recognition algorithym which causes the X/Y table to be moved by a servomechanism so that the precise location of each of the bonding sites of each of the semiconductor chips of each of the hybrid substrates on vacuum chuck 1 is detected and stored in the memory of computer 23. Then the automatic bonding operation automatically takes place. After all of the necessary wire bonds (or die bonding operations) have been completed on all of the hybrid substrates, the vacuum is released. All six wire bonded hybrid substrates can be quickly slid into a waiting carrier, and six new unbonded hybrid substrates can be quickly slid into position to reload vacuum chuck 1 and the procedure is repeated.

To summarize them, the invention provides, for the first time, an economical method and apparatus for rapidly loading and unloading a large number of hybrid substrates onto a vacuum chuck of a high speed modern automatic wire bonding machine or automatic die bonding machine, and precisely holds all of the hybrid substrates perfectly in fixed positions relative to an automatically movable X/Y support despite repetitive bonding steps and rapid acceleration and deceleration of the X/Y support as it is moved to align different bonding sites with the bonding head.

While the invention has been described with reference to a particular embodiment thereof, those skilled in the art will be able to make various modifications to the described embodiment of the invention without departing from the true spirit and scope thereof. It is intended that all elements and steps which are equivalent to those described herein in that they perform substantially the same function in substantially the same way to achieve substantially the same result be encompassed within the scope of the invention.

We claim:

1. A method for supporting a plurality of flat bottom integrated circuit devices each having a large number of bonding pads during a large number of wire bonding operations thereon, each of the integrated circuit devices having a plurality of leads extending downward from its flat bottom, the method comprising the steps of:
   (a) providing a plurality of closed loop grooves in a flat upper surface of a chuck, and providing means extending through portions of the chuck for communicating a vacuum to regions surrounded by the closed loop grooves;
   (b) positioning a plurality of clsoed resilient loops in the closed loop grooves, respectively, so that opposed inner and outer surface side portions of the resilient loops tightly contact adjacent surfaces of the respective closed loop grooves, the depths of the closed loop grooves and the diameters of the cross-sections of the resilient loops begin such that an upper portion of each resilient loop extends a predetermined distance above the flat upper surface of the chuck;
   (c) sliding a plurality of the intergated circuit devices in end-to-end fashion onto the chuck from a carrier, the plurality of grooves being positioned so that when one of the integrated circuit devices is positioned over one of the closed loop grooves and the flat bottom of that integrated circuit device rests on the corresponding resilient loop, the adjacent integrated circuit device is aligned over the adjacent closed loop groove with its flat bottom resting on the resilient loop therein;
   (d) producing a vacuum in the vacuum communicating means and hence in the regions enclosed by the flat bottom surfaces of the respective integrated circuit devices, the upper portions of the resilient loops, and the flat upper surface of the chuck, drawing the flat bottom surfaces of the integrated circuit device toward the flat upper surface of the chuck, compressing the loops of resilient material to produce a vacuum seal and to increase the contact area and friction between the resilient loops and the flat bottom surfaces of the integrated circuit devices, and also compressing the resilient loops more tightly into the closed loop grooves to nearly completely fill the closed loop grooves to resist rolling of the resilient loops in the closed loop grooves; and
   (e) operating a computer controlled high speed wire bonding machine to rapidly apply a large number of large magnitude lateral acceleration and deceleration forces to the chuck while the vacuum remains uninterrupted to sequentially move all of the bonding pads of all of the integrated circuit devices into alignment with a wire bonding head, performing a wire bonding operation at each bonding pad in rapid succession as that bonding pad comes into alignment with the wire bonding head,
   each of the bonding pads being approximately four mils in diameter, there being at least approximately a hundred such bonding pads on each of the integrated circuit devices,
   the resiliency of the resilient loop material, the predetermined distance, the tightness of the fit of resilient loops in the respective closed loop grooves, and the amount of the vacuum having values selected to prevent cumulative lateral displacement of any of the integrated circuit devices, which cumulative lateral displacement is appreciable compared to the size of the bonding pads, from occurring between the first and last of the wire bonding operations, by causing the compressing of the resilient loops to be sufficient to cause the upper portions of the resilient loops to be pressed entirely into and nearly completely fill the upper portions of the respective closed loop grooves, thereby further resisting rolling of the resilient loops, wherein the large magnitudes of the lateral acceration and deceleration forces are so great that cumulative lateral shifting of the integrated circuit devices on the chuck, which cumulative lateral shifting is appreciable compared to the size of the bonding pads, would occur during the wire bonding operations it there were substantially less compressing of the resilient loops.

2. A method for supporting a plurality of flat bottom integrated circuit devices each having a large number of bonding pads during a large number of wire bonding operations thereon, each of the integrated circuit devices having a plurality of leads extending downward from its flat bottom, the method comprising the steps of:

(a) providing a plurality of closed loop grooves in a flat upper surface of a chuck, and providing means extending through portions of the chuck for communicating a vacuum to regions surrounded by the closed loop grooves;

(b) positioning a plurality of closed resilient loops in the closed loop grooves, respectively, so that opposed inner and outer surface side portions of the resilient loops tightly contact adjacent surface of the respective closed loop grooves, the depths of the closed loop grooves and the diameters of the cross-sections of the resilient loops being such that an upper portion of each resilient loop extends a predetermined distance above the flat upper surface of the chuck;

(c) providing a pair of relatively deep lead receiving slots in the flat upper surface of the chuck, one slot on either side of the respective closed loop grooves, and sliding a plurality of the integrated circuit devices in end-to-end fashion onto the chuck from a carrier so that various leads of the integrated circuit device slide laterally through the respective lead receiving slots, the plurality of grooves being positioned so that when one of the integrated circuit devices is positioned over one of the closed loop grooves and the flat bottom of that integrated circuit device rests on the corresponding resilient loop, the adjacent integrated circuit device is aligned over the adjacent closed loop groove with its flat bottom resting on the resilient loop therein;

(d) producing a vacuum in the vacuum communicating means and hence in the regions enclosed by the flat bottom surfaces of the respective integrated circuit devices, the upper portions of the resilient loops, and the flat upper surface of the chuck, drawing the flat bottom surfaces of the integrated circuit device toward the flat upper surface of the chuck, compressing the loops of resilient material to produce a vacuum seal and to increase the contact area and friction between the resilient loops and the flat bottom surfaces of the integrated circuit devices, and also compressing the resilient loops more tightly into the closed loop grooves to nearly completely fill the closed loop grooves to resist rolling of the resilient loops in the closed loop grooves; and (e) operating a computer controlled high speed wire bonding machine to rapidly apply a large number of large magnitude lateral acceleration and deceleration forces to the chuck while the vacuum remains uninterrupted to sequentially move all of the bonding pads of all of the integrated circuit devices into alignment with a wire bonding head, performing a wire bonding operation at each bonding pad in rapid succession as that bonding pad comes into alignment with the wire bonding head, each of the bonding pads being approximately four mils in diameter, there being at least approximately a hundred such bonding pads on each of the integrated circuit devices, the resiliency of the resilient loop material, the predetermined distance, the tightness of the fit of resilient loops in the respective closed loop grooves, and the amount of the vacuum having values selected to prevent cumulative lateal displacement of any of the integrated circuit devices, which cumulative lateral displacement is appreciable compared to the size of the bonding pads, from occurring between the first and last of the wire bonding operations, by causing the compressing of the resilient loops to be sufficient to cause the upper portions of the resilient loops to be pressed entirely into and nearly completely fill the upper portions of the respective closed loop grooves, thereby further resisting rolling of the resilient loops, wherein the large magnitudes of the lateral acceleration and deceleration forces are so great that cumulative lateral shifting of the integrated circuit devices on the chuck, which cumulative lateral shifting is appreciable compared to the size of the bonding pads, would occur during the wire bonding operations if there were substantially less compressing of the resilient loops.

3. The method of claim 2 including sliding the first of the integrated circuit devices onto the chuck so that is encounters a stop on the upper surface of the chuck when the integrated circuit device is properly aligned on a resilient loop.

4. The method of claim 2 wherein the compressing of the resilient loops causes the flat bottom surfaces of the integrated circuit devices to sufficiently tightly contact the flat upper surface of the chuck to make efficient thermal contact therewith.

5. The method of claim 4 wherein the upper portions of the resilient loops extend approximately five mils above the flat upper surface of the chuck.

6. The method of claim 5 wherein the durometer rating of the resilient loops is in the range from about 40 to 70.

7. The method of claim 6 wherein the tolerance of the flatness of the bottoms of the integrated circuit devices is about three mils.

* * * * *